(12) United States Patent
Hershberg et al.

(10) Patent No.: US 10,536,159 B2
(45) Date of Patent: Jan. 14, 2020

(54) METHOD FOR IMPROVING FEEDBACK CIRCUIT PERFORMANCE

(71) Applicant: IMEC vzw, Leuven (BE)

(72) Inventors: Benjamin Hershberg, Leuven (BE); Ewout Martens, Heverlee (BE); Jan Craninckx, Boutersem (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/110,891

(22) Filed: Aug. 23, 2018

(65) Prior Publication Data
US 2019/0068212 A1 Feb. 28, 2019

(30) Foreign Application Priority Data

Aug. 28, 2017 (EP) ..................................... 17188158

(51) Int. Cl.
*H03M 1/18* (2006.01)
*H03F 3/50* (2006.01)
(Continued)

(52) U.S. Cl.
CPC ............. *H03M 1/183* (2013.01); *G01R 29/26* (2013.01); *G05F 1/70* (2013.01); *H03F 3/505* (2013.01); *H03M 13/612* (2013.01)

(58) Field of Classification Search
CPC ........ H03M 1/183; H03F 1/301; H03F 1/342; H03F 1/3217; H03F 1/3211; H03F 1/3205; H03F 1/308
(Continued)

(56) References Cited

U.S. PATENT DOCUMENTS

| 4,053,846 A | * | 10/1977 | Acker | .................. | H03G 1/0052 |
| | | | | | 330/110 |
| 6,060,935 A | * | 5/2000 | Shulman | ................ | G06G 7/186 |
| | | | | | 327/336 |

(Continued)

OTHER PUBLICATIONS

Hershberg, Benjamin et al., "A 75.9dB-SNDR 2.96mW 29fJ/conv-step Ringamp-Only Pipelined ADC," 2013 Symposium on VLSI Circuits Digest of Technical Papers, Jun. 12, 2013, pp. C94-C95.
(Continued)

*Primary Examiner* — Lam T Mai
(74) *Attorney, Agent, or Firm* — Knobbe Martens Olson & Bear, LLP

(57) ABSTRACT

The disclosed technology relates to a method for improving performance of a feedback circuit comprising an amplifier and a feedback network, wherein the feedback circuit has at least one tunable component. In one aspect, the method comprises measuring first amplitude values at an input of the amplifier and second amplitude values at an output of the amplifier, estimating a linear open-loop gain of the amplifier based on both the amplitude values, estimating a linear finite gain error based on the estimated gain and the second amplitude values, subtracting the linear finite gain error from the first amplitude values to derive a set of samples containing second error information, deriving an signal-to-noise-plus-distortion ratio estimate based on the variance of the set of samples and a variance of the second amplitude values, and adjusting the feedback circuit in accordance with the signal-to-noise-plus-distortion ratio estimate.

20 Claims, 5 Drawing Sheets

(51) Int. Cl.
*H03M 13/00* (2006.01)
*G01R 29/26* (2006.01)
*G05F 1/70* (2006.01)

(58) Field of Classification Search
USPC ........ 341/143–155; 330/149, 129, 297, 159; 327/345, 336, 344
See application file for complete search history.

(56) References Cited

U.S. PATENT DOCUMENTS

| | | |
|---|---|---|
| 6,784,814 B1 | 8/2004 | Nair |
| 7,271,750 B1 | 9/2007 | Ali |
| 7,616,142 B1 | 11/2009 | Mai |
| 8,629,726 B1 * | 1/2014 | Madison ................ H03F 3/082 330/253 |
| 9,276,529 B1 * | 3/2016 | Brown ................ H03F 3/45179 |
| 2002/0089374 A1 * | 7/2002 | McRory ................ H03F 1/3241 330/149 |
| 2006/0012499 A1 | 1/2006 | Ihs |
| 2006/0072632 A1 * | 4/2006 | Flanders ............... G01J 1/4257 372/20 |
| 2013/0169365 A1 * | 7/2013 | Lee ...................... H03G 1/0082 330/282 |
| 2013/0257537 A1 * | 10/2013 | Mourant .................. H03F 1/34 330/260 |
| 2014/0184333 A1 * | 7/2014 | Lee ...................... H03G 3/3084 330/282 |

OTHER PUBLICATIONS

Miyahara, Yuichi et al., "A 14b 60 MS/s Pipelined ADC Adaptively Cancelling Opamp Gain and Nonlinearity", IEEE Journal of Solid-State Circuits, vol. 49, No. 2, Feb. 2014, pp. 416-425.

Tseng, Chien-Jian et al., "A 10-b 320-MS/s Stage-Gain-Error Self-Calibration Pipeline ADC," IEEE Journal of Solid-State Circuits, vol. 47, No. 6, Jun. 1, 2012, pp. 1334-1343.

Weaver, Skyler et al., "Stochastic Flash Analog-to-Digital Conversion," IEEE Transactions on Circuits and Systems-I: Regular Papers, vol. 57, No. 11, Nov. 1, 2010, pp. 2825-2833.

Extended European Search Report for European Patent Application No. 17188158.4, dated Feb. 16, 2018 by European Patent Office.

* cited by examiner

METHOD FOR IMPROVING FEEDBACK CIRCUIT PERFORMANCE

CROSS-REFERENCE TO RELATED APPLICATIONS

This application claims foreign priority to EP 17188158.4, filed on Aug. 28, 2017, the contents of which is incorporated by reference herein in its entirety.

BACKGROUND

Field

The disclosed technology is generally related to the field of techniques for improving the performance of a feedback circuit comprising an amplifier.

Description of the Related Technology

The performance of feedback circuits comprising an amplifier is typically quantified by its stability, noise performance and overall optimality. The stability is affected by various factors among which the process, voltage and temperature (PVT) variations, distortion and noise are most prominent. However, in practical implementations it is not always possible to guarantee optimal stability of feedback circuits if employing a non-tunable amplifier circuit across all PVT variation corners. In such a case, it is necessary to have a background calibration to maintain optimal performance conditions. For example, ring amplification—an amplification paradigm commonly used in switched capacitor feedback circuits—offers several prominent advantages in scaled CMOS technologies. However, due to their dynamic mechanisms of self-stabilization, the stability of ring amplifiers (ringamps) must be carefully considered.

Hence, there is a need for techniques to maintain optimal performance in case a feedback circuit is present in such schemes.

SUMMARY OF CERTAIN INVENTIVE ASPECTS

It is an objective of various embodiments of the disclosed technology to provide for a method to improve the performance of a feedback circuit as used in various types of feedback structures.

The above objective is accomplished by the solution according to the disclosed technology.

In a first aspect, the disclosed technology relates to a method for improving performance of a feedback circuit comprising an amplifier and a feedback network, said feedback circuit having at least one tunable component. One such method comprises measuring a first plurality of amplitude values at an input of the amplifier and a second plurality of amplitude values at an output of the amplifier given a first setting of the feedback circuit, estimating a linear open-loop gain of the amplifier based on the first and the second plurality of amplitude values, estimating a linear finite gain error based on the estimated linear open-loop gain and the second plurality of amplitude values, subtracting the linear finite gain error from the first plurality of amplitude values to derive a set of processed samples containing error information different from the linear finite gain error, deriving a signal-to-noise-plus-distortion estimate based on the variance of the set of processed samples and a variance of the second plurality of amplitude values, and adjusting the first setting of the feedback circuit in accordance with the signal-to-noise-plus-distortion ratio estimate.

The disclosed technology allows for obtaining an estimate of the signal-to-noise-plus-distortion ratio, which can subsequently be used for tuning the feedback circuit.

In one embodiment, estimating the linear open-loop gain comprises an averaging of the first and the second plurality of amplitude values.

Advantageously, a binning technique may also be applied to speed up said averaging.

In another embodiment, a first analog-to-digital converter is used for measuring the first plurality of amplitude values and a second analog-to-digital converter for the second plurality of amplitude values at the amplifier output, said first and said second analog-to-digital converter arranged for sampling synchronously. The first analog-to-digital converter may be a stochastic ADC comprising a noisy comparator.

In other embodiments, the signal-to-noise-plus-distortion ratio estimate is replaced by a total harmonic distortion estimate.

In one embodiment, the method comprises a step of removing static offset from the set of processed samples.

In some embodiments, the amplifier is a ring amplifier.

In one embodiment, said ring amplifier is part of a pipelined analog-to-digital converter with a plurality of stages, each stage having a multiplying digital-to-analog converter (MDAC) and a feedback circuit. Such method may then also comprise a step of monitoring the ring amplifier while the pipelined ADC is operative.

In another embodiment, the performance is improved by tuning the stability of the feedback circuit.

In yet another embodiment, estimating the linear open-loop gain of the amplifier is performed based on the expression $$\hat{A}_{OL} = \frac{\Sigma V_{out,i,q}^2}{\Sigma V_{out,i,q} \hat{V}_{x,i}},$$

where $\hat{A}_{OL}$ denotes the open-loop gain estimate, $V_{out,i,q}$ the quantized amplitude values at said output of said amplifier generated by said second analog-to-digital converter and $\hat{V}_{x,i}$ represent estimates of the amplitude values at the input of said amplifier computed from the outputs of the said first and second analog-to-digital converters.

For purposes of summarizing the disclosed technology and advantages achieved over the prior art, certain objectives and advantages of the disclosed technology have been described herein above. Of course, it is to be understood that not necessarily all such objectives or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objectives or advantages as may be taught or suggested herein.

The above and other aspects of the disclosed technology will be apparent from and elucidated with reference to the embodiment(s) described hereinafter.

BRIEF DESCRIPTION OF THE DRAWINGS

The disclosure will now be described further, by way of example, with reference to the accompanying drawings, wherein like reference numerals refer to like elements in the various figures.

DETAILED DESCRIPTION OF CERTAIN ILLUSTRATIVE EMBODIMENTS

Figure 1:
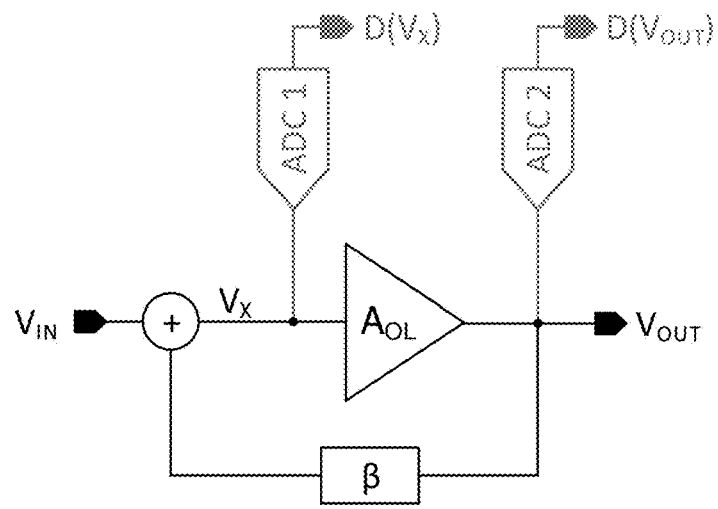
FIG. 1 illustrates a general scheme of a feedback circuit to explain the disclosed technology.

The disclosed technology will be described with respect to particular embodiments and with reference to certain drawings though the present innovations are not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, though they may. Furthermore, the particular features, structures or characteristics may be combined in any suitable manner, as would be apparent to one of ordinary skill in the art from the disclosed technology, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed innovations require more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

It should be noted that the use of particular terminology when describing certain features or aspects of the disclosed technology should not be taken to imply that the terminology is being re-defined herein to be restricted to include any specific characteristics of the features or aspects of the disclosed technology with which that terminology is associated.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

The disclosed technology pertains to techniques for improving the overall performance of a feedback circuit comprising an amplifier by using a signal-to-noise-plus-distortion ratio (SNDR) as an indication of presence of uncorrected errors. The quantified information on errors can then be used as such or in a calibration algorithm to optimize the circuit performance in terms of SNDR by adjusting the circuit's tunable components. Aspects of the disclosed technology relate to novel techniques for determining the SNDR of feedback circuits and using this measure for improving the circuit's performance.

The disclosed technology can be applied in numerous applications. For example, it can be used for improving the stability of a feedback circuit which affects the circuit performance, as stability is reflected in the SNDR measure of the circuit. Similarly, it can be used for optimizing the ringamp settling behaviour in switched capacitor circuits such as pipelined ADCs. Another example application is the cancellation of non-linear distortion in an amplifier. Non-linear distortion is observed in an amplifier (e.g. operational amplifier, ring amplifier or any other amplifier) that has a dominant $3^{rd}$ harmonic. In such case, the $3^{rd}$ harmonic dominates the SNDR of the circuit. By using the information of the SNDR measurement according to the disclosed technology, it is possible to add a tunable element to the amplifier (if not yet available) which cancels the power of the $3^{rd}$ harmonic. For example, the tunable element is adjusted until the SNDR is maximized, indicating that the distortion is minimized.

The disclosed technology, however, extends its usefulness to many types of amplifier and feedback structures. Generally speaking, the approach is applicable to any type of operational amplifier and any type of resistive or switched-capacitor feedback network. Amplifier-wise, this includes the broad class of transconductance amplifiers, but also extends to other types such as ringamps. Application-wise, this includes circuits where feedback networks are used such as filters, ADCs, sensors, buffers, and signal processing in general.

The disclosed technology is, however, first explained in its broader context. A method will be presented for approximating the circuit's SNDR. The disclosed technology will then be explained in the context of a ringamp in a multiplying digital-to-analog converter (MDAC) feedback circuit in a pipeline ADC as a background stability tracking and tuning scheme.

The disclosed technology relating to approximating the SNDR starts with a measurement step. A general feedback circuit containing an amplifier with a finite gain $A_{OL}$, having input node $V_X$ and output node $V_{OUT}$ and a feedback network ($\beta$) as illustrated in FIG. 1 is considered. The voltages at nodes $V_X$ and $V_{OUT}$ are measured. Connected to nodes $V_X$ and $V_{OUT}$ are ADCs that sample and digitize the voltage values at these nodes. The output of each ADC is a stream of digitized sampled voltage values. Using the digitized outputs of the ADCs, the disclosed technology determines both the linear open-loop gain of the amplifier ($A_{OL}$) and the SNDR of the circuit as detailed below.

The signal present at $V_X$ is composed of several error sources, such as linear finite gain error, non-linear finite gain error, incomplete settling error, and random noise sources. Ideally, in such circuits, there is no component in $V_X$ that is part of the wanted signal, i.e., $V_X$ is only error. $V_{OUT}$, by comparison, is primarily composed of the actual wanted signal; noise and distortion are still present, but at much lower relative levels.

The voltage values at the $V_X$ and $V_{OUT}$ nodes are periodically sampled and digitized by ADC1 and ADC2, respectively. Henceforth, two streams of digitized $V_{OUT}$ and $V_X$ values, i.e., $D(V_{OUT})$ and $D(V_X)$, are obtained, which correspond to two vectors of data acquired from the output of ADC1 and ADC2. By multiplying with the corresponding LSB, the quantized values for $V_{OUT}$ and $V_X$ are obtained. These two vectors are aligned, i.e., the voltage values at the input and at the output of the amplifier are sampled at the same time instant.

If there are DC offsets (static offsets) in the vectors $V_X$ and/or $V_{OUT}$ due to mismatch of analog components, the DC offsets need to be removed from vectors prior to computing $\hat{A}_{OL}$.

Next, an estimate of the linear open-loop gain of the amplifier ($\hat{A}_{OL}$) can be calculated from a large number of samples of $V_X$ and $V_{OUT}$, as:

$$\hat{A}_{OL} = \frac{\Sigma V_{out,i,q}^2}{\Sigma V_{out,i,q} V_{x,i,q}}, \quad (1)$$

where i is the sample number, $V_{out,i,q}$ is the quantized value of $V_{OUT}$ as generated by ADC2 and $V_{x,i,q}$ is the quantized value of $V_X$ as generated by ADC1. Herein, q is used to denote $V_x$ and $V_{out}$ is quantized. To reduce the hardware cost, ADC1 can be replaced by a stochastic ADC comprising a noisy comparator. In this case, the output of this comparator cannot be used directly in the equation to estimate the open-loop gain, above, instead an estimation for $V_X$ has to be first computed as follows. All comparator outputs corresponding to the samples with the same digitized $V_{OUT}$ value are used to estimate the $V_X$ value at the input of the comparator. This estimation is based on the principle of a stochastic ADC: the average comparator output is mapped via an inverse error function (or a look-up table) onto the input voltage:

$$\hat{V}_{x,i} = \sqrt{2}\,\sigma \mathrm{erf}^{-1}\left(\frac{2k}{N} - 1\right)$$

with k the number of '1's returned by the comparator, N the number of comparisons and $\sigma$ the rms value of the noise of the comparator.

The estimation of the open-loop gain is then computed as follows:

$$\hat{A}_{OL} = \frac{\Sigma V_{out,i,q}^2}{\Sigma V_{out,i,q} \hat{V}_{x,i}}, \quad (2)$$

where $\hat{V}_{x,i}$ is the estimation of $V_X$ for sample i. Note that all samples with the same digitized $V_{OUT}$ value will use the same estimation for $V_X$. To get a good estimation of $V_X$, many samples are needed, typically in the order of a few thousand. When there are $2^N$ different digitized $V_{OUT}$ values, there are also $2^N$ different $V_X$ estimates and the total number of points needed to compute all $V_X$ estimates and subsequently the open-loop gain estimate quickly ranges from a few hundred thousand to a few million.

The number of samples needed depends on the accuracy of the required estimate and on the resolution of ADC1 and ADC2.

To speed up the estimation process for $V_X$ and thereby the derivation of $\hat{A}_{OL}$, a so-called binning technique is introduced. The binning significantly reduces the number of samples to be used to obtain a $\hat{A}_{OL}$ value of a sufficiently high accuracy. Instead of performing independent estimation of $V_X$ for each digitized $V_{OUT}$ value, continuous ranges of $V_{OUT}$ codes can be grouped together and their $V_X$ values can be placed into so-called bins to speed up processing. All values in a bin are used to compute the estimation of $V_X$. There are now only as many different estimates for $V_X$ as there are bins, and the estimations $\hat{V}_{x,i}$ used in the computation of $\overline{A}_{OL}$ only take as many different values as the number of bins. Numerous approaches to an exact implementation of binning are possible.

As $V_{OUT}$ can validly be assumed a sufficiently accurate approximation of the ideal output signal, the component of $V_X$ due to linear finite gain error can be removed since it is simply a scaled replica of $V_{OUT}$. Taking the estimate of $A_{OL}$ already computed using Equation (1) or (2) one obtains the vector:

$$\epsilon_{gain,Vx} = \frac{V_{OUT}}{\hat{A}_{OL}} \quad (3)$$

Subtracting this from vector $V_X$ one has:

$$\epsilon_{other,Vx} = V_X - \epsilon_{gain,Vx} \quad (4)$$

Equation (4) yields a vector of processed samples containing only the information about non-linearities, settling error and random noise processes in the feedback circuit. In case these error sources are not zero-mean, an extra processing step may be needed to remove the static offset.

Taking the variance of Equation (4), the average uncalibrated error power present at $V_X$ node can be expressed as a scalar:

$$\text{var}(\epsilon_{other,Vx}) \tag{5}$$

Computing also the variance of $V_{OUT}$, the estimate of the SNDR at the output of the feedback circuit can be computed:

$$SNDR_{estimate} = \frac{\text{var}(V_{OUT})}{\text{var}(\epsilon_{other,Vx})} \tag{6}$$

The computed value is not an exact SNDR value, since $V_{OUT}$ is assumed to be noiseless whereas in fact it also contains noise that is erroneously treated as signal here. However, for practical uses this does not pose a problem since it is typically not needed to know the exact SNDR value, only the relative change in SNDR with respect to some optimization control variable is of interest.

In the case where the resolution of ADC1 is low, such as when it is embodied by a stochastic ADC, another formulation of Equation (6) may be preferred, such as:

$$THD_{estimate} = \frac{\text{var}\left(\text{sign}(Vx) \cdot \left|\text{mean}\left(\frac{V_{OUT}}{A_{OL}}\right)\right| - \frac{V_{OUT}}{A_{OL}}\right)}{\text{var}(V_{OUT})} \tag{7}$$

A stochastic estimation process does not capture information about the random noise error in the $\hat{V}_{x,i}$ estimates, only about the systematic error. Therefore, when a stochastic ADC is used for ADC1, an estimation is obtained which is closer to the Total Harmonic Distortion (THD) than SNDR, but because THD is a key component of SNDR, it also provides a SNDR estimate.

Once an SNDR estimate is obtained, the SNDR value is fed to a control unit which aims at maximizing the SNDR by adjusting the circuit's tunable components. The SNDR value may be used as such. In this case, the control unit will adjust the tunable components (increase or decrease) until the maximum SNDR value is reached. Alternatively, the SNDR value can be used in an algorithm, such as least mean squares (LMS) or gradient descent so that a faster convergence to a maximum SNDR value is reached.

Figure 2:
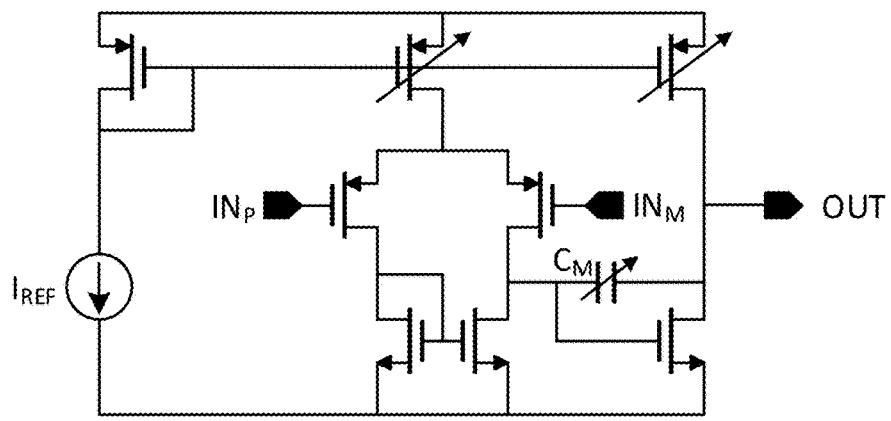
FIG. 2 illustrates an example implementation of a tunable two-stage Miller compensated operational transconductance amplifier (OTA).

The tuning can be achieved in various ways known to skilled person. For example, for a two-stage Miller compensated operational transconductance amplifier (OTA) illustrated in FIG. 2, the SNDR gives an indication of the circuit's stability. By tracking the SNDR and tuning, for example, by digitally adjusting the size of the Miller capacitor $C_M$ connected between the opamp's stage 1 output and stage 2 output, and/or by changing the bias currents of stage 1 or stage 2 of the transistors indicated as variable elements, the stability can be maintained.

Ring amplifiers may be implemented in many different ways, each having their own possibilities for tuning. A full generalization of all possible ringamp tuning techniques is therefore unfeasible to give. However, some specific examples are presented here. In the ringamp structure of FIG. 3, the stability can be adjusted by varying the deadzone voltage $V_{DZ}$ used to program the voltage offset on the capacitors at the output of stage 1. In the differential ringamp with CMOS resistor dynamic stability biasing of FIG. 4, variable voltages at DZN and DZP nodes can be used to adjust the dynamic biasing resistance and thus the ringamp's stability performance.

Figure 3:
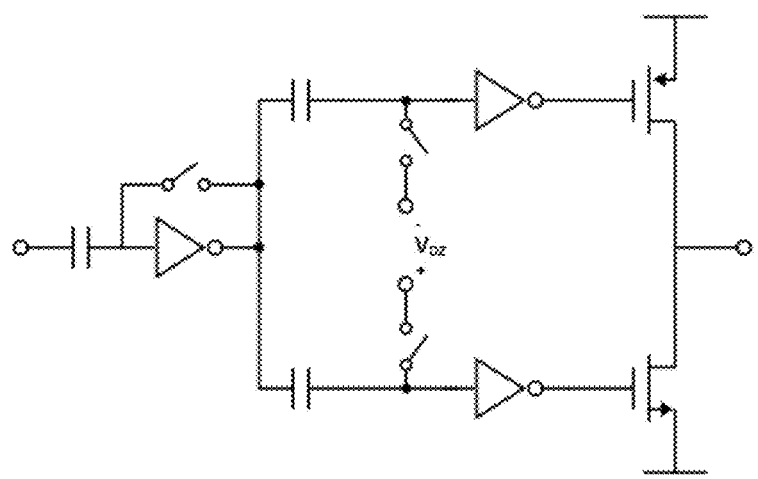
FIG. 3 illustrates an example implementation of a tunable ring amplifier.
Figure 4:
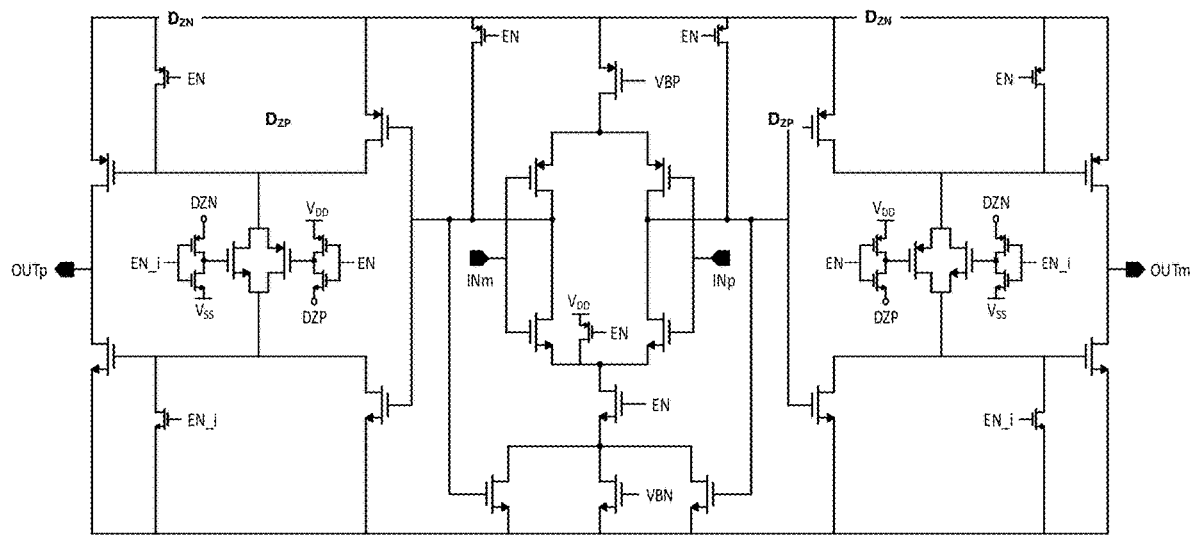
FIG. 4 illustrates an example implementation of a tunable differential ring amplifier with CMOS resistor dynamic stability biasing.
Figure 5:
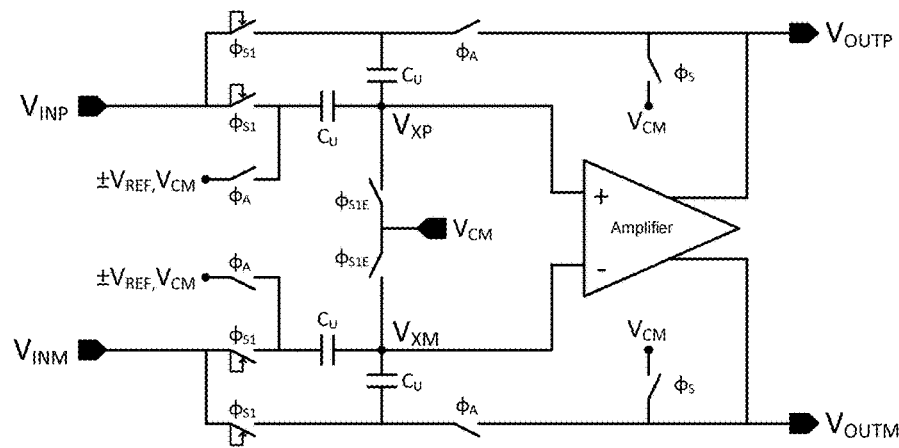
FIG. 5 illustrates an example scheme of a pipelined ADC multiplying digital-to-analog converter (MDAC) using an amplifier.
Figure 6:
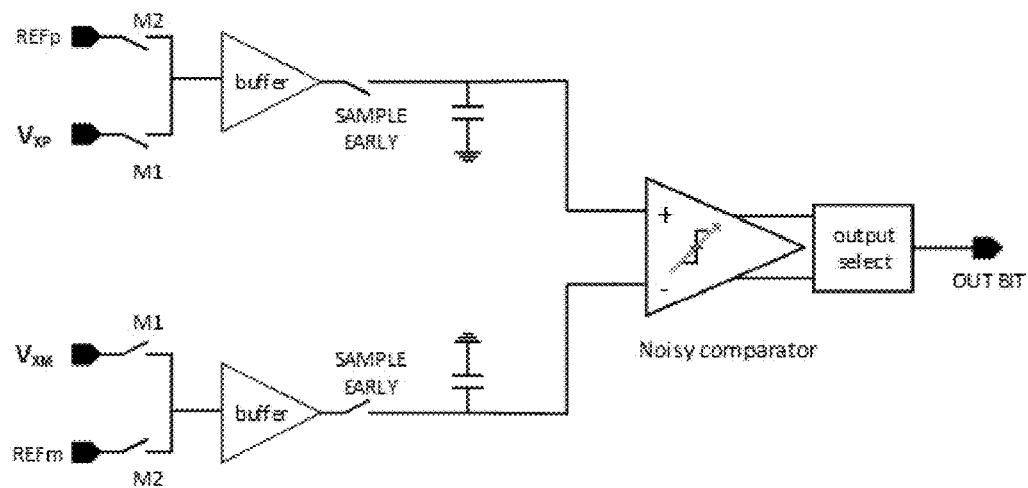
FIG. 6 illustrates an example scheme of a stochastic ADC with a noisy comparator used to extract $V_X$ values.

The disclosed technology will now be described in the context of a pipelined ADC multiplying digital-to-analog converter (MDAC) as shown in FIG. 5 and using a ring amplifier as in FIG. 3. In this structure the linear finite gain error and the ringamp settling/stability of the ring amplifier are PVT dependent. Hence, to improve the circuit's performance these parameters need to be tracked and corrected continuously. This correction is in a preferred embodiment performed in the background. The present technology can be applied here to improve the linear finite gain error and ringamp settling/stability using the disclosed method. Recall that the method relies on knowledge of $V_{OUT}$ (here, this is the output of the given pipeline stage's residue) and $V_X$ (the "virtual ground" floating node at the amplifier input in FIG. 1). For $V_{OUT}$ a digital version $D(V_{OUT})$ is already available in a pipelined ADC, since $D(V_{OUT})$ is simply the reconstructed digital output of all subsequent stages. This makes the disclosed technology particularly well suited for use in pipelined ADCs. For $V_X$ additional hardware is needed to obtain $D(V_X)$, which may be a high or low resolution ADC, or be as simple as a noisy comparator as shown in FIG. 6.

The benefit of using the main pipelined ADC as ADC2 and a single comparator for ADC1 is that a very low complexity and "cheap" hardware solution is realized leading to a simpler and a lower power solution in comparison to using high resolution ADCs for both ADC1 and ADC2.

Figure 7:
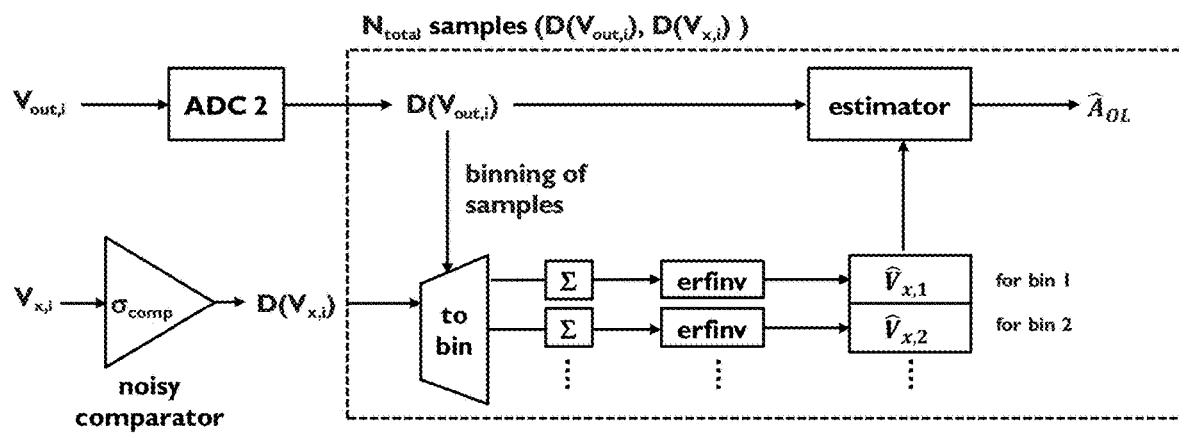
FIG. 7 illustrates a block scheme of computations to be performed according to the disclosed technology.

For the implementation shown in FIGS. 5 and 6, where ADC2 represents all the subsequent stages of the main pipelined ADC and ADC1 is a stochastic ADC, an approach as follows can be taken. Reference is thereby made to FIG. 7 showing a block scheme of the disclosed technology. For each value of $V_{OUT}$ digitized with high precision by ADC2, a related quantization of $V_X$ is taken. This quantization of $V_X$ can be lower than the required resolution, even as low as 1 bit resolution. A so-called binning technique is used next. In the naïve case, where the bin width=1, for the 2-dimensional vector of output sets $\{D(V_{OUT}), D(V_X)\}$, the values of all $D(V_X)$ corresponding to a unique $D(V_{OUT})$ value are averaged together. This is done for all values of $D(V_{OUT})$. The result is a bin for each unique value of $D(V_{OUT})$, said bin being the average value of $D(V_X)$ associated with that value of $D(V_{OUT})$. Then, the average $D(V_X)$ value in each bin is passed through an inverse error function (erfinv) and scaled with respect to the $V_{REF}$ of the stochastic ADC (obtained by quantizing a known reference voltage with the stochastic ADC). With sufficient samples and averaging, this then produces a high accuracy quantization of $D(V_X)$ for each $D(V_{OUT})$, which can next be fed into the estimator block which calculates the open loop gain $A_{OL}$ of the amplifier. Next, the low resolution values $D(V_X)$ are replaced by their higher precision estimates obtained during the stochastic estimation and binning process. The result is a vector containing a high precision estimate of the systematic errors present in $V_X$, but not the random noise errors. From this, an estimator equation such as (6) or (7) can be used to estimate THD, which in turn is an estimation of SNDR.

To reduce the number of samples required, a bin width larger than 1 can be used, wherein a continuous range of $D(V_{OUT})$ values is associated with each bin. If bins containing a uniform distribution of $V_{OUT}$ are available, simple averaging of the $V_X$ values regardless of the bin width is sufficient. However, if the distribution is non-uniform, as is the case with many modulated signals, simple averaging of the $V_X$ values in the bin increases the quantization error for bin widths >1. It is possible to reduce this error by tracking the distribution of $V_{OUT}$ values in the input vector associated with that bin that occur, and then weight the $V_X$ values in the bin based on the knowledge of this distribution and according to their associated $V_{OUT}$ value, prior to averaging the $V_X$ values.

Numerous tests have shown that the order of execution matters in the numerical noise of the calculations in the estimator block and that there are other equations available to calculate estimates for $A_{OL}$ and SNDR, each with measurable differences in final accuracy and speed of the loop. The estimator equations found to work best are:

$$\hat{A}_{OL} = \frac{\Sigma V_{out,i,q}^2}{\Sigma V_{out,i,q} \hat{V}_{x,i}} \qquad (8)$$

and $$\widehat{SNDR} = \frac{\text{var}(V_{out,i,q})}{\text{var}\left(\text{sign}(\hat{V}_{x,i}) \cdot \left|\text{mean}\left(\frac{V_{out,i,q}}{\hat{A}_{OL}}\right)\right| - \frac{V_{out,i,q}}{\hat{A}_{OL}}\right)} \qquad (9)$$

The calculated SNDR can then be used as a performance indicator according to which the ring amplifier can be tuned. Herein, the SNDR parameter is then fed to a control block (not shown in FIG. 7) which using the SNDR value as such or in an algorithm such as an LMS or gradient descent technique, outputs a control signal that controls the tunable components of the circuit (i.e. $V_{DZ}$ of the ringamp). Due to the use of the $\hat{A}_{OL}$ and $\widehat{SNDR}$ specific formulation of the Equations (8) and (9), a faster convergence and resilience to numerical noise is obtained.

Figure 8A:
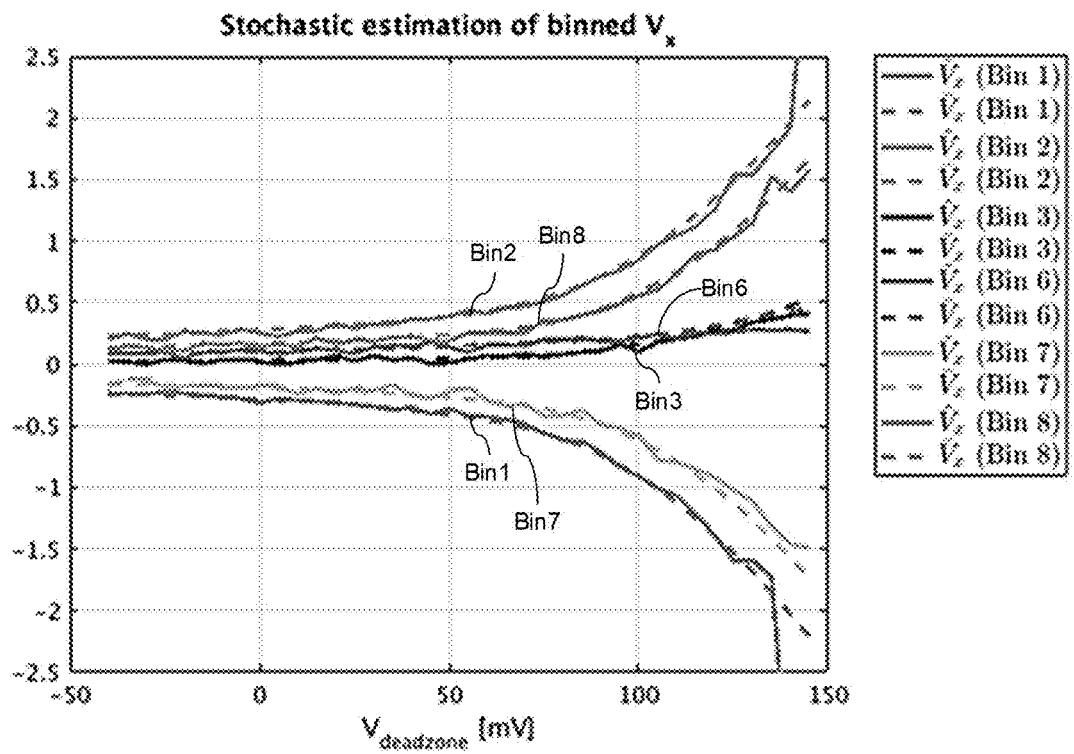
FIGS. 8A, 8B and 8C illustrate results of Matlab simulations related to the disclosed technology.
Figure 8B:
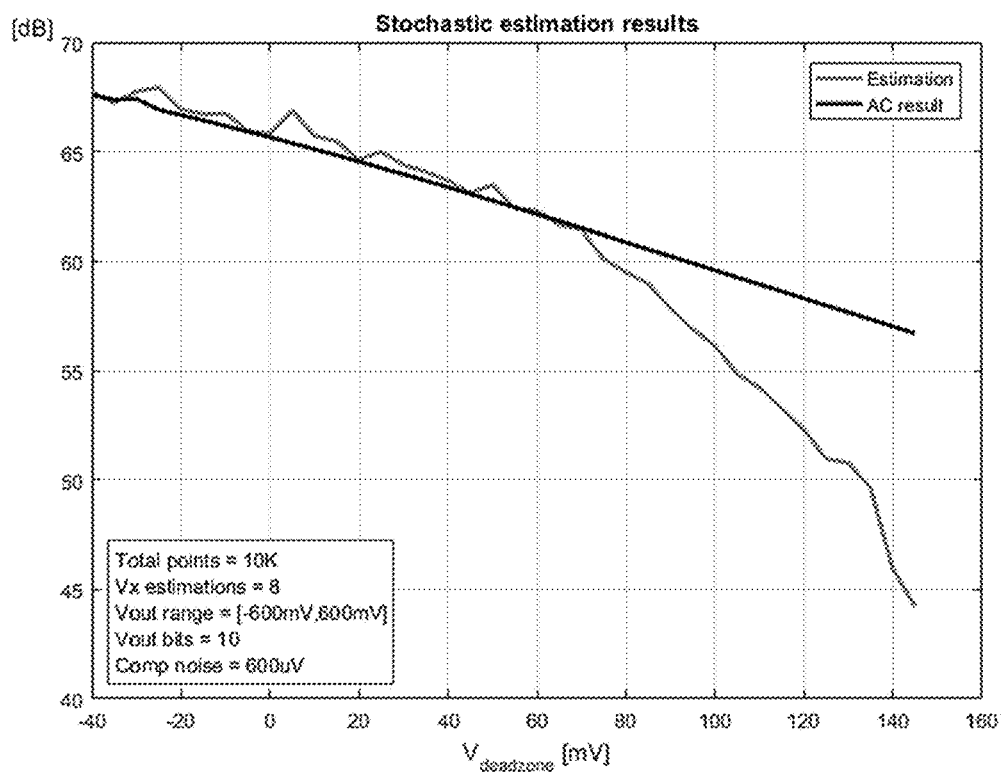
Figure 8C:
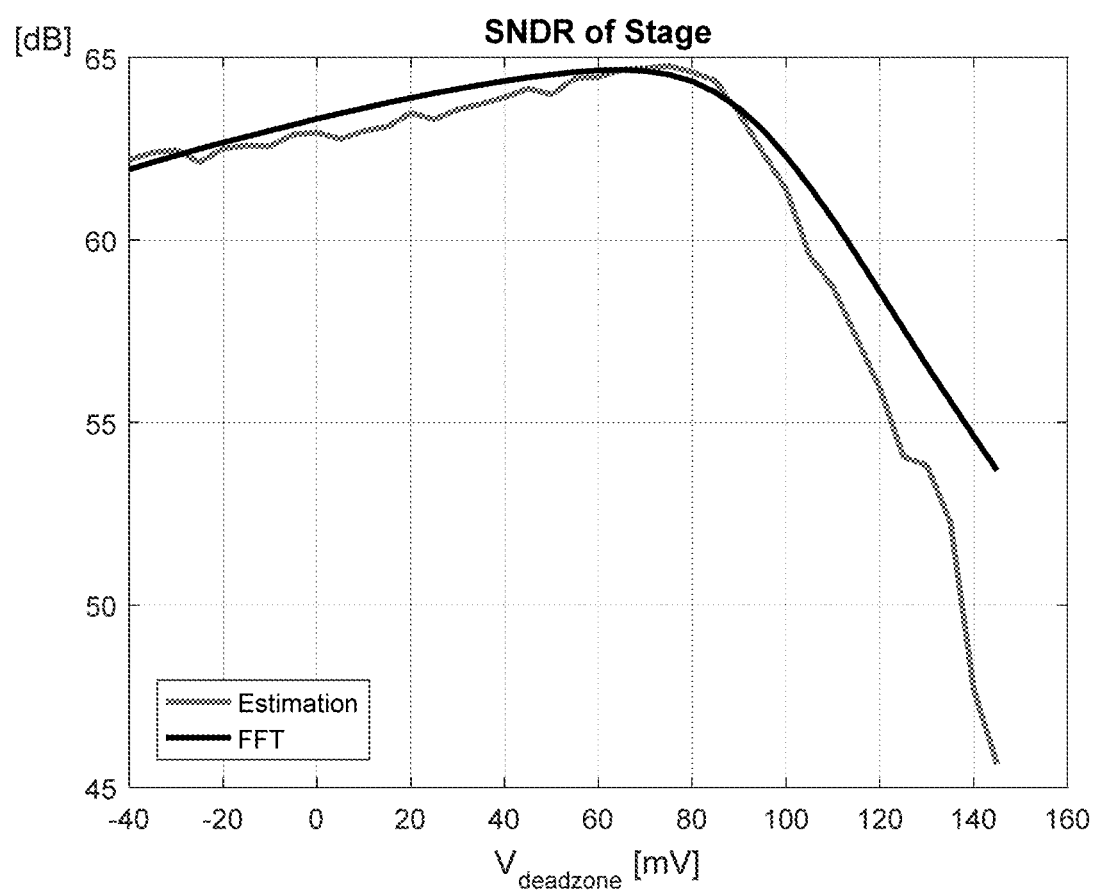

FIGS. 8A, 8B and 8C illustrate Matlab simulation results for the method implementation of FIG. 7. FIG. 8A shows for a select subset of 8 bins the estimated (solid lines) and ideal averaged values (dashed lines) of $V_X$ versus the ringamp's stability tuning parameter $V_{DZ}$. A binning segmentation of eight bins evenly divided across the full range of $V_{OUT}$ values is used. Due to binning, even with a relatively low total number of samples (e.g. 10 k), a sufficiently accurate estimation of $V_X$ can be obtained for eight discrete bins when using the noisy comparator to measure $V_X$. FIG. 8B shows the estimated (labelled 'Estimation') and ideal values (labelled 'AC result') of the open-loop gain $A_{OL}$ versus the tuning parameter $V_{DZ}$ when the estimator implements Equations (8) and (9). To measure $V_{OUT}$, the subsequent stages of the pipelined ADC are used. The estimation of the SNDR is shown in FIG. 8C which compares the estimation with the ideal value obtained via FFT computations.

Note that it was not previously realized that SNDR could be derived from $V_{OUT}$ and $V_X$ data. Moreover it is found that this specific formulation of Equations (8) and (9) provides faster convergence and resilience to numerical noise. Although, the estimates of the open-loop gain and the SNDR values are described in digital domain, i.e., using the digital version of $V_X$ and $V_{OUT}$ signals, it is also possible to estimate the open-loop gain and the SNDR values directly in analog domain.

While the disclosed technology has been illustrated and described in detail in the drawings and foregoing description, such illustration and description are to be considered illustrative or exemplary and not restrictive. The foregoing description details certain embodiments of the disclosed technology. It will be appreciated, however, that no matter how detailed the foregoing appears in text, the invention may be practiced in many ways, and the invention is not limited to the disclosed embodiments.

Other variations to the disclosed embodiments can be understood and effected by those skilled in the art in practicing the field of technology, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A method for improving a performance of a feedback circuit comprising an amplifier and a feedback network, the feedback circuit having at least one tunable component, the method comprising:
    measuring a first plurality of amplitude values at an input of the amplifier ($V_X$) and a second plurality of amplitude values at an output of the amplifier ($V_{OUT}$) given a first setting of the feedback circuit,
    estimating a linear open-loop gain of the amplifier ($A_{OL}$) based on the first and the second plurality of amplitude values,
    estimating a linear finite gain error ($e_{gain}$) based on the estimated linear open-loop gain and the second plurality of amplitude values,
    subtracting the linear finite gain error ($e_{gain}$) from the first plurality of amplitude values to derive a set of processed samples containing error information different from the linear finite gain error,
    deriving a signal-to-noise-plus-distortion ratio estimate based on a variance of the set of processed samples and a variance of the second plurality of amplitude values, and
    adjusting the first setting of the feedback circuit in accordance with the signal-to-noise-plus-distortion ratio estimate.

2. The method of claim 1, wherein the estimating the linear open-loop gain comprises an averaging of the first and the second plurality of amplitude values.

3. The method of claim 2, wherein a binning technique is applied to speed up the averaging.

4. The method of claim 1, wherein a first analog-to-digital converter is used for measuring the first plurality of amplitude values and a second analog-to-digital converter for the second plurality of amplitude values at the amplifier output, the first and the second analog-to-digital converter arranged for sampling synchronously.

5. The method of claim 4, wherein the first analog-to-digital converter is a stochastic analog-to-digital converter comprising a noisy comparator.

6. The method of claim 5, wherein a total harmonic distortion estimate replaces the signal-to-noise-plus-distortion ratio estimate.

7. The method of claim 1, further comprising a step of removing static offset from the set of processed samples.

8. The method of claim 1, wherein the amplifier comprises a ring amplifier.

9. The method of claim 8, wherein the ring amplifier is part of a pipelined analog-to-digital converter with a plurality of stages, each stage having a multiplying digital-to-analog converter (MDAC), and a feedback circuit.

10. The method of claim 9, further comprising a step of monitoring the ring amplifier while the pipelined ADC is operative.

11. The method of claim 1, wherein the performance is improved by tuning stability of the feedback circuit.

12. The method of claim 1, wherein estimating the linear open-loop gain of the amplifier is performed based on the expression $$\hat{A}_{OL} = \frac{\Sigma V_{out,i,q}^2}{\Sigma V_{out,i,q} \hat{V}_{x,i}}$$

where $\hat{A}_{OL}$ denotes the open-loop gain estimate, i the sample number, $V_{out,i,q}$ the quantized amplitude values at the output of the amplifier and $\hat{V}_{x,i}$ estimates of the amplitude values at the input.

13. The method of claim 2, wherein a first analog-to-digital converter is used for measuring the first plurality of amplitude values and a second analog-to-digital converter for the second plurality of amplitude values at the amplifier output, the first and the second analog-to-digital converter arranged for sampling synchronously.

14. The method of claim 13, wherein the first analog-to-digital converter is a stochastic analog-to-digital converter comprising a noisy comparator.

15. The method of claim 14, wherein a total harmonic distortion estimate replaces the signal-to-noise-plus-distortion ratio estimate.

16. The method of claim 15, wherein the amplifier is a ring amplifier.

17. The method of claim 16, wherein the ring amplifier is part of a pipelined analog-to-digital converter with a plurality of stages, each stage having a multiplying digital-to-analog converter (MDAC), and a feedback circuit.

18. The method of claim 17, further comprising a step of monitoring the ring amplifier while the pipelined ADC is operative.

19. The method of claim 18, wherein the estimating the linear open-loop gain of the amplifier is performed based on the expression $$\hat{A}_{OL} = \frac{\Sigma \hat{V}_{out,i,q}^2}{\Sigma \hat{V}_{out,i,q} \hat{V}_{x,i}}$$

where $\hat{A}_{OL}$ denotes the open-loop gain estimate, i the sample number, $\hat{V}_{out,i,q}$ the quantized amplitude values at the output of the amplifier and $\hat{V}_{x,i}$ estimates of the amplitude values at the input.

20. The method of claim 3, wherein a first analog-to-digital converter is used for measuring the first plurality of amplitude values and a second analog-to-digital converter for the second plurality of amplitude values at the amplifier output, the first and the second analog-to-digital converter arranged for sampling synchronously.

* * * * *